United States Patent [19]

Kinoshita et al.

[11] Patent Number: 4,876,984
[45] Date of Patent: Oct. 31, 1989

[54] APPARATUS FOR FORMING A THIN FILM

[75] Inventors: Mikio Kinoshita, Kawasaki; Wasaburo Ohta, Yokohama; Toru Miyabori, Kawasaki, all of Japan

[73] Assignee: Ricoh Company, Ltd., Tokyo, Japan

[21] Appl. No.: 204,279

[22] Filed: Jun. 9, 1988

[30] Foreign Application Priority Data

Jun. 12, 1987 [JP] Japan .................. 62-146554
Jun. 12, 1987 [JP] Japan .................. 62-146555

[51] Int. Cl.⁴ .................. C23C 8/36; C23C 14/32; C23C 16/50
[52] U.S. Cl. .................. 118/723; 118/50.1; 204/192.31; 204/298
[58] Field of Search .................. 118/723, 50.1; 204/192.31, 298 PI

[56] References Cited

U.S. PATENT DOCUMENTS 3,583,361 6/1971 Laudel .
4,676,194 6/1987 Satou .................. 204/192.31
4,707,238 11/1987 Okubo .................. 204/192.31
4,725,345 2/1988 Sakamoto .................. 204/192.31

FOREIGN PATENT DOCUMENTS 0035894 9/1981 European Pat. Off. .
0095384 11/1983 European Pat. Off. .
0141417 5/1985 European Pat. Off. .
55-141562 11/1980 Japan .................. 204/192.31
59-089763 5/1984 Japan .................. 204/192.31
581935 10/1946 United Kingdom .
809330 2/1959 United Kingdom .
866150 4/1961 United Kingdom .
1092744 11/1967 United Kingdom .
1209266 10/1970 United Kingdom .
1542496 3/1979 United Kingdom .
2175015 11/1986 United Kingdom .

OTHER PUBLICATIONS

Bunshah, Deposition Technologies for Films and Coatings, Noyes Publications, Park Ridge, N.J. © 1982, p. 103.
Bunshah, Deposition Technologies for Films and Coatings, Noyes Publications ©1982, p. 258.

Primary Examiner—Richard Bueker
Attorney, Agent, or Firm—Oblon, Spivak, McClelland, Maier & Neustadt

[57] ABSTRACT

An apparatus for forming a thin film having a vacuum container evacuated to high vacuum and receiving a gas for vapor deposition, a source of evaporation for evaporating a substance, a counter electrode holding a substrate to be vapor-deposited, a grid disposed between the source and the electrode for accelerating the evaporated substance, and an electronic gun for emitting thermions, which are hit on the evaporated substances to ionize them.

7 Claims, 2 Drawing Sheets

APPARATUS FOR FORMING A THIN FILM

BACKGROUND OF THE INVENTION

This invention relates to an apparatus for forming a thin film.

Conventionally, there are known thin film forming methods such as CVD or PVC and proposed various apparatuses for forming a thin film using these methods.

In an attempt to form at low temperatures a thin film which has excellent adhesiveness, Applicant once proposed an apparatus for forming a thin film which included a source of evaporation, a counter electrode holding a substrate which opposes the source of evaporation, a filament disposed between the source of evaporation and the substrate for generating thermions, and a grid disposed between the filament and the counter electrode and impressed with positive potential relative to the counter electrode (Published Unexamined Japanese Patent Application 89763/1984).

According to this apparatus, substances evaporated from the source of evaporation are ionized by thermions from the filament, the ionized substances are accelerated by an electric field established between the grid and the counter electrode and impinged on the substrate to thereby form a thin film. If the potential of the grid relative to the counter electrode is too high, ions may be excessively accelerated to thereby damage the thin film. Therefore, the potential of the grid is desired to be lowered as much as possible, which, however, cannot strongly accelerate thermions from the filaments, the density of thermions having energy suitable for that ionization is reduced, the rate of ionization of evaporated substances is reduced, so that problems would possibly arise in the adhesiveness of a thin film to be formed to the substrate and in the crystalline property of the thin film. Adjustment of the grid potential for forming a good thin film is troublesome in this apparatus.

SUMMARY OF THE INVENTION

It is an object of the present invention to provide an apparatus for forming a thin film which is capable of forming a good thin film easily and reliably at low temperature.

According to the present invention, the object can be achieved by an apparatus for forming a thin film comprising;

a vacuum container evacuated to high vacuum and receiving a gas for vapor deposition therein, a source of evaporation disposed within said container for evaporating a substance to be evaporated, a counter electrode disposed within said container and holding a substrate to be vapor-deposited such that said substrate opposes said source, a grid disposed between said source and said electrode for allowing said evaporated substances to pass therethrough and accelerating said evaporated substances, and an electronic gun disposed within said container for emitting thermions, which are hit on said evaporated substances existing between said source and said electrode to ionize said evaporated substances.

In the thin film formation according to this first apparatus, the evaporated substances are ionized and electrically accelerated so as to have high energy, so that it is unnecessary to provide additional energy required for film formation and crystallization in the form of heat and it is possible to form a thin film on a substrate, for example, of a plastic material having low thermal stability. Since sufficient ionization efficiency is achieved even if the grid potential is low, a good thin film not significantly influenced by ion impact is obtained.

Since the thermions generated by the gun contribute very effectively to the ionization of evaporated substances, it is possible to ionize evaporated substances even under high vacuum conditions lower than $10^{-3}$ Pa, so that only a few gas particles are taken into the formed thin film and thus the thin film is of high purity. It is also possible to provide a very close thin film structure. Although it is said that the density of a thin film is usually lower than that of the bulk, a thin film having a density substantially equal to that of the bulk is provided according to the inventive apparatus.

An apparatus for forming a thin film according to the first invention is very suitable for the formation of thin semiconductor films constituting LSIs and ICs, etc., and thin metal films of high purity used for electrodes.

According to the present invention, the object can be also achieved by an apparatus for forming a thin film comprising;

a vacuum container evacuated to high vacuum and receiving a gas for vapor deposition therein, a source of evaporation disposed within said container for evaporating a substance to be evaporated, a counter electrode disposed within said container and holding a substrate to be vapor-deposited such that said substrate opposes said source, a grid disposed between said source and said electrode for allowing said evaporated substances to pass therethrough and accelerating said evaporated substances, an electronic gun disposed within said container for emitting thermions, which are hit on said evaporated substances existing between said source and said electrode to ionize said evaporated substances, a guiding means for deflecting electromagnetically a path of said emitted thermions and guiding said emitted thermions toward a space in the vicinity of said grid, a shielding member disposed within said container for preventing a direct impact, onto said substrate, of particles including said thermions emitted from said gun, and a slit disposed in said shielding member for allowing said guided thermions to pass therethrough and arrive at said space.

In this second apparatus, in addition to the effects of the first invention, the substrate is free from direct impact of emissions from the gun by the shielding member. Thus a rise in the temperature of the substrate due to the direct impact of the emissions and contamination of the thin film by the emitted metal ions are satisfactorily prevented.

In the present invention an active gas, an inert gas or a mixture of an active gas and an inert gas is introduced to the vacuum container.

The source of evaporation is means for evaporating substances to be evaporated within the vacuum container and may be various well-known sources of evaporation, for example, in the form of a coil or a boat to be described later in more detail. Alternatively, it may be a source of evaporation using electronic beams.

The grid is disposed between the source of evaporation and the counter electrode and has a structure through which the evaporated substances can pass; for example, a net. In the present invention, the power source means realizes a predetermined electrical state in the vacuum container.

During thin film formation, the grid is kept positive relative to the counter electrode by the power source means.

The evaporated substances are ionized by the thermions emitted from the gun so that they can be ionized efficiently even if the grid potential is low.

Particularly in the second apparatus, the guiding means deflects the path of thermions emitted from the gun electrically and/or magnetically and guides the thermions through the slit in the shielding member to a space in the vicinity of the grid. The shielding member prevents direct impact of neutral particles and/or ions emitted from the gun onto the substrate. Thus the substrate is not thermally damaged by the emissions.

DETAILED DESCRIPTION OF THE PREFERRED EMBODIMENT

An embodiment of the first apparatus will now be described with reference to FIG. 1 of the drawings.

Figure 1:
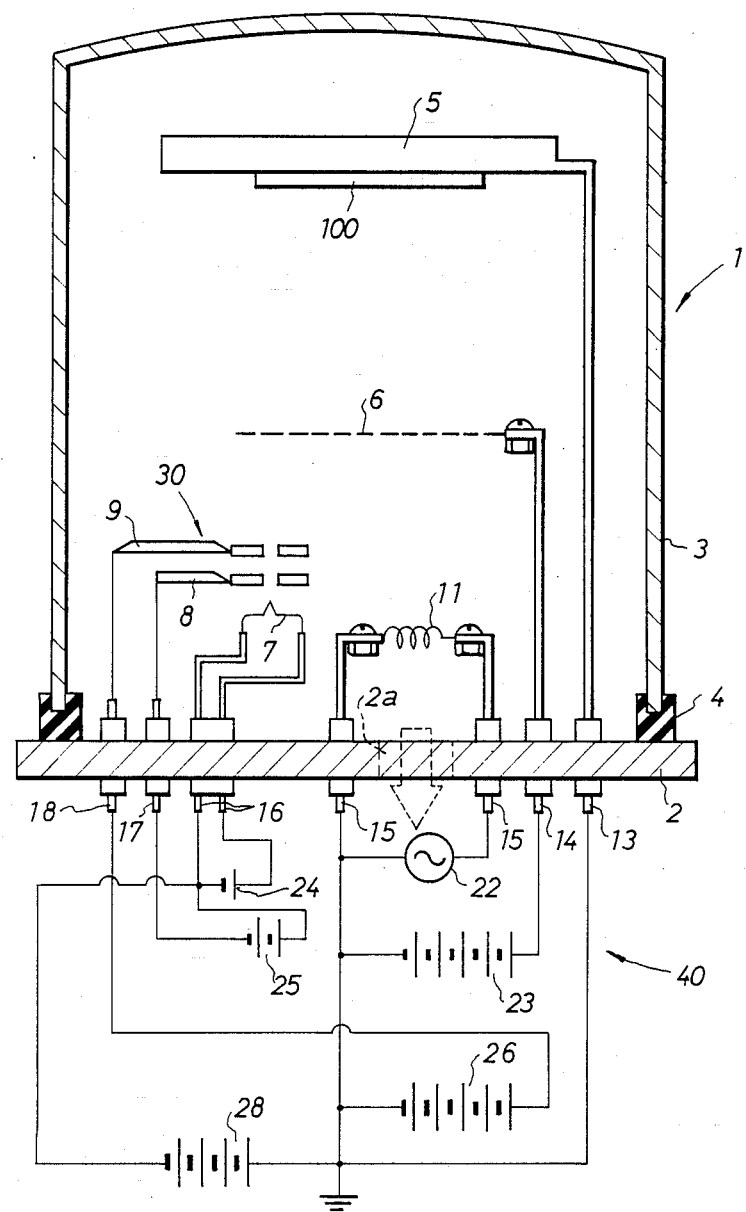
FIG. 1 illustrates an embodiment of the first apparatus of the present invention.

In FIG. 1, reference numeral 1 denotes a vacuum container which is composed of a baseplate 2 and a bell jar 3 assembled with the baseplate 2 through a packing 4 so as to form a shielded space within the container. The baseplate 2 has a hole 2a and the internal shielded space within the container 1 is in fluid communication with an evacuation system, not shown, via the hole 2a in airtight relationship. The container 1 is adapted to receive an active gas or an inert gas or a mixture of both in a well-known manner.

Disposed within the container 1 are a source of evaporation 11, a counter electrode 5, a grid 6 and an electronic gun 30, as shown. The electronic gun 30 is composed of an anode 9, an auxiliary grid 8 and a filament 7.

The respective members within the container 1 are supported by the corresponding ones of supporters 13, 14, 15, 16, 17 and 18.

The supporters 13 to 18 are made of a conductive material, insulated from the baseplate 2, and extend through the baseplate 2 outside the container so as to ensure the airtightness of the container 1. The supporters support the corresponding elements inside the container and electrically connect the elements inside and outside the container. The supporters constitute the conductive means together with other wiring means.

The counter electrode 5 and the source 11 are provided substantially horizontal within the container 1.

The source 11 is of resistance heating type which takes the form of a coil, for example, mode of a metal such as tungsten or molybdenum. As described above, it may be any one of various conventional sources of evaporation such as a boat-like source of evaporation or a source of evaporation using electronic beams.

The power source means 40 is provided outside the container and includes an AC power source 22, DC power sources 23, 24, 25, 26 and 28, as shown, and other various operated switches, not shown.

The above power sources are connected as follows. The AC power source 22 is used for heating the source 11 and connected to the source 11 via a pair of the supporters 15.

Among the power sources 23 to 26 and 28, the power source 23 has its plus electrode connected via the supporter 14 to the grid 6 and its minus electrode connected via the supporter 13 to the counter electrode 5. The power source 24 is connected to a pair of the supporters 16 supporting the filament 7 of the gun 30. The power source 25 has its plus electrode connected to the minus electrode of the power sources 24 and 28, and its minus electrode connected to the auxiliary grid 8 of the gun 30 via the supporter 17. The power source 26 has its plus electrode connected to the anode 9 of the gun 30 via the supporter 18 and its minus electrode grounded. The power source 28 has its plus electrode grounded and its minus electrode connected to the minus electrode of the power source 24. The grounding as shown is not necessarily required.

The grid 6 has a structure such as a net through which the evaporated substances can pass and is maintained by the power source 23 at positive potential relative to the counter electrode 5. Therefore, an electric field directed from the grid 6 to the counter electrode 5 is established between the grid 6 and the counter electrode 5.

A well-known electronic lens or the like may be provided to the apparatus shown. The gun 30 may be disposed at a position different from its current one, as shown, such that the guns at the current and different positions are symmetrical with reference to a horizontal plane containing the grid 6. Of course, piping may be provided so as to introduce water for cooling the substrate 100 and the gun 30 into the container.

The thin film formation using the first embodiment will now be described.

A substrate 100 on which a thin film is to be formed is kept on the counter electrode 5 so as to oppose the source 11 via the grid 6, as shown. The substances to be evaporated are held on the source 11. The substances to be evaporated are selected in accordance with the type of a thin film to be formed, and may be, for example, aluminum, metal such as gold, a metal oxide, a fluoride, a sulfide or an alloy.

An active gas, an inert gas or a mixture of both is introduced at a pressure of 10 to $10^{-3}$ Pa into the container 1. For clarity of explanation, it is assumed here that the introduced gas is an inert gas such as argon.

If the apparatus is operated under such conditions, the substances to be evaporated and held by the source of evaporation 11 evaporate. The evaporated substances which now take the form of evaporated fine particles fly dispersively toward the substrate 100 through the grid 6.

The thermions are emitted from the gun 30, also fly toward the grid 6, and hit on the flying evaporated fine particles to thereby ionize same. Thus plasma is realized in the space in the vicinity of the grid. The ionized evaporated substances are accelerated toward the substrate 100 by the action of the electric field directed from the grid 6 to the counter electrode 5 and hit on the substrate 100 at high speeds. Thus a desired thin film is formed on the substrate 100.

The density, energy and spatial distribution of the thermions emitted from the gun 30 can be controlled by control of the power source means, so that even if the potential of the grid 6 is low, the evaporated substances can be ionized effectively.

If an active gas is introduced by itself or together with an inert gas into the container 1 to form a thin film, the evaporated substances can be combined with the active gas to thereby provide a thin compound film.

For example, if argon and oxygen are selected as the inert gas and active gas, respectively, the pressure is adjusted to $10^{-1}$ to $10^{-2}$ Pa and aluminum is selected as substance to be evaporated, a thin film of $Al_2O_3$ will be formed on the substrate.

If Si or SiO is selected as the substance to be evaporated, a thin film of $SiO_2$ will be obtained. If In or Zn is selected as the substance to be evaporated, a thin film of $In_2O_3$ or ZnO will be obtained respectively. If $H_2S$ and Cd are selected as the gas and the substance to be evaporated, respectively, a thin film of CdS will be obtained. If ammonia and argon are both selected as the active gas, and Ti or Ta is selected as the substance to be evaporated, a thin film of TiN or TaN will be obtained.

An embodiment of the second apparatus will now be described with reference to FIG. 2 of the drawings.

Figure 2:
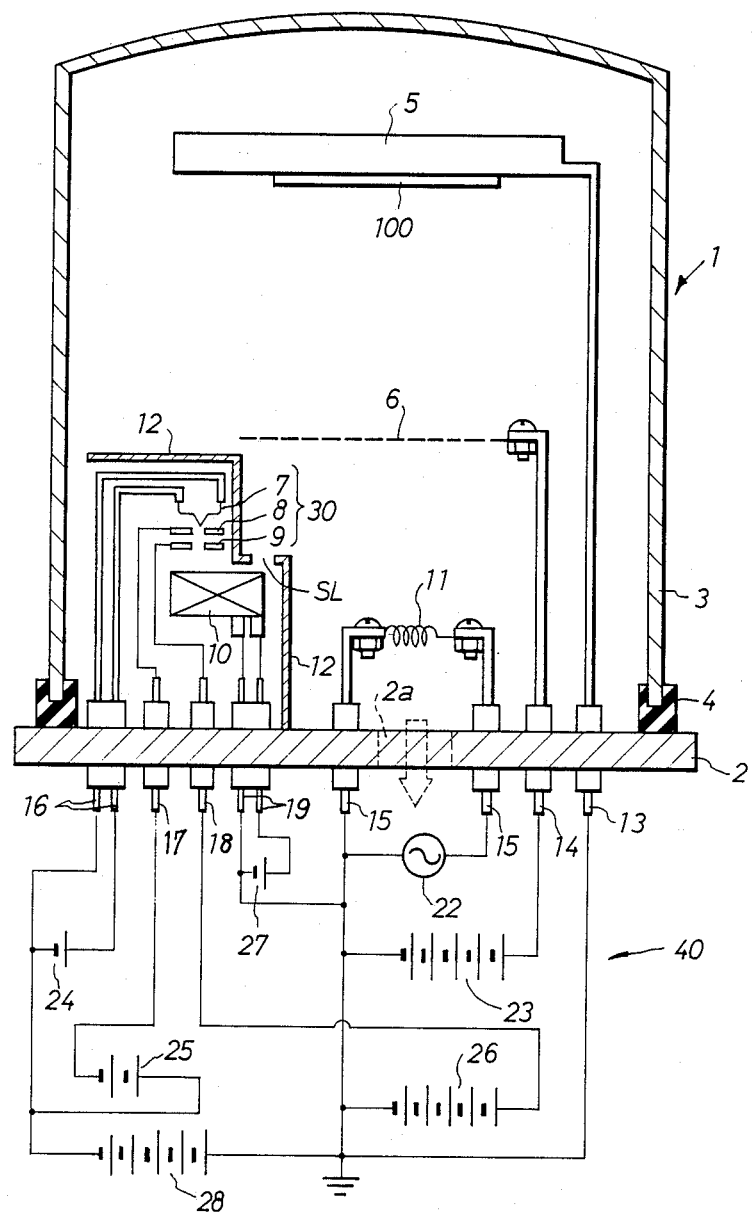
FIG. 2 illustrates an embodiment of the second apparatus of the present invention.

The same components in FIG. 2 as those in FIG. 1 carry the same reference numerals.

In FIG. 2, reference numeral 1 denotes a vacuum container which is composed of a baseplate 2 and a bell jar 3 assembled with the baseplate 2 through a packing 4 so as to form a shielded space within the container. The base plate 2 has a hole 2a and the internal shielded space within the container 1 is in fluid communication with an evacuation system, not shown, via the hole 2a in airtight relationship. The container 1 is adapted to receive an active gas or an inert gas or a mixture of both in a well-known manner.

Disposed within the container 1 are a source of evaporation 11, a counter electrode 5, a grid 6 and an electronic gun 30, a pair of deflecting coils 10, and a shielding member 12, as shown. The gun 30 is composed of an anode 9, an auxiliary grid 8 and a filament 7.

The respective members within the container 1 are supported by the corresponding ones of supporters 13, 14, 15, 16, 17, 18 and 19.

The supporters 13 to 19 are made of a conductive material, insulated from the baseplate 2, and extend through the baseplate 2 outside the container so as to ensure the airtightness of the container 1. The supporters support the corresponding elements inside the container and electrically connect the element inside and outside the container. The supporters constitute the conductive means together with other wiring means.

The counter electrode 5 and the source 11 are provided substantially horizontal within the container container 1.

The source 11 is of a resistance heating type which takes the form of a coil, for example, made of a metal such as tungsten or molybdenum. As described above, it may be any one of various conventional sources of evaporation such as a boat-like source of evaporation or a source of evaporation using electronic beams.

The power source means 40 is provided outside the container and includes an AC power source 22, DC power sources 23, 24, 25, 26, 27 and 28, as shown, and other various operated switches, not shown.

The above power sources are connected as follows. The AC power source 22 is used for heating the source 11 and is connected to the source 11 via a pair of the supporters 15.

Among the power sources 23 to 28, the power source 23 has its plus electrode connected via the supporter 14 to the grid 6 and its minus electrode connected via the supporter 13 to the counter electrode 5. The power source 24 is connected to the pair of the supporters 16 supporting the filament 7 of the gun 30. The power source 25 has its plus electrode connected to the minus electrodes of the power sources 24 and 28, and its minus electrode connected to the auxiliary grid 8 of the gun 30 via the supporter 17. The power source 26 has its plus electrode connected to the anode 9 of the gun 30 via the supporter 18 and its minus electrode grounded. The power source 27 is connected to the supporter 19 which supports the pair of deflecting coils 10. The power source 28 has its plus electrode grounded and its minus electrode connected to the minus electrode of the power source 24. The grounding as shown is not necessarily required.

The grid 6 has a structure such as a net through which the evaporated substances can pass and is maintained by the power source 23 at positive potential relative to the counter electrode 5. Therefore, an electric field directed from the grid 6 to the counter electrode 5 is established between the grid 6 and the counter electrode 5.

The shielding member 12 is formed so as to cover the gun 30 and the pair of deflecting coils 10, as shown, to thereby prevent the direct impact of particles emitted from the gun filament 7 such as thermions, neutral particles and/or ions onto the substrate 100 held by the counter electrode 5. The pair of deflecting coils 10 is constructed and disposed so as to generate a magnetic field for deflecting the thermions. The magnetic field extends through from the back side to the front side of the plane of FIG. 2. The thermions emitted from the gun 30 are entered into the magnetic field established by the deflecting coils 10, their paths are deflected by the magnetic deflecting field, guided through the slit SL in the shielding member 12 into a space in the vicinity of the grid 6.

An additional slit and a well-known electronic lens or the like may be provided to the apparatus shown. The gun 30, the pair of deflecting coils 10, the shielding member 12 and the slit SL may be disposed at positions different from their current ones, as shown, such that those elements at the current and different positions are symmetrical with reference to a horizontal plane containing the grid 6. Of course, piping may be provided so as to introduce water for cooling the substrate 100 and the gun 30 into the container. A power source means may be provided for applying a bias voltage to the shielding member 12.

The thin film formation using the second embodiment will now be described.

A substrate 100 on which a thin film is to be formed is kept on the counter electrode 5 so as to oppose the source 11 via the grid 6, as shown. The substances to be evaporated are held on the source 11. The substances to be evaporated are selected in accordance with the type of a thin film to be formed, and may be, for example, aluminum, metal such as gold, a metal oxide, a fluoride, a sulfide or an alloy.

An active gas, an inert gas or a mixture of both is introduced at a pressure of 10 to $10^{-3}$ Pa into the container 1. For clarity of explanation, it is assumed here that the introduced gas is an inert gas such as argon.

If the apparatus is operated under such conditions, the substances to be evaporated and held by the source of evaporation 11 evaporate. The evaporated substances which now take the form of evaporated fine particles fly dispersively toward the substrate 100 through the grid 6.

The thermions are emitted from the gun 30. They are guided while making a counterclockwise circle orbit due to the magnetic field for deflecting thermions established by the pair of deflecting coils 10. They then pass through the slit SL in the shielding member 12 toward the grid 6, and hit on the flying evaporated substances to thereby ionize same. Thus plasma is realized in the space in the vicinity of the grid. The ionized evaporated substances are accelerated toward the substrate 100 by the action of the electric field directed from the grid 6 to the counter electrode 5 and hit on the substrate 100 at high speeds. Thus a desired thin film is formed on the substrate 100.

By the shielding member 12, the substrate 100 is protected from the direct impact of emissions from the filament 7. Thus a rise in the temperature of the substrate 100 which would otherwise be caused by the direct impact of the emissions is effectively prevented and also the contamination of the thin film by the emitted metal ions is prevented satisfactorily.

The density, energy and spatial distribution of the thermions emitted from the gun 30 can be controlled by control of the power source means, so that even if the potential of the grid 6 is low, the evaporated substances can be ionized effectively.

If an active gas is introduced by itself or together with an inert gas into the container 1 to form a thin film, the evaporated substances can be combined with the active gas to thereby provide a thin compound film.

For example, if argon and oxygen are selected as the inert gas and active gas, respectively, the pressure is adjusted to $10^{-1}$ to $10^{-2}$ Pa and aluminum is selected as the substance to be evaporated, a thin film of $Al_2O_3$ will be formed on the substrate.

If Si or SiO is selected as the substance to be evaporated, a thin film of $SiO_2$ will be obtained. If In or Zn is selected as the substance to be evaporate, a thin film of $In_2O_3$ or $ZnO$ will be obtained. If $H_2S$ and Cd are selected as the gas and substance to be evaporated, respectively, a thin film of CdS will be obtained. If ammonia and argon are both selected as the active gas, and Ti, Ta are selected as the substances to be evaporated, a thin film of TiN or TaN will be obtained.

Though in the embodiment of the second invention the magnetic guiding means using a magnetic field has been described, an electric guiding means using an electronic field such as capacitor electrodes having an appropriate form may be used by itself or in combination with a magnetic field generation coil.

The present invention is not limited to the above embodiments and may be modified in various forms without departing from the spirit and scope of the invention.

What is claimed is:

1. An apparatus for forming a thin film comprising;
    a vacuum container evacuated to high vacuum and receiving a gas for vapor deposition therein,
    a source of evaporation disposed within said container for evaporating a substance to be evaporated,
    a counter electrode disposed within said container and holding a substrate to be vapor-deposited such that said substrate opposes said source,
    a grid disposed between said source and said electrode for allowing said evaporated substances to pass therethrough and accelerating said evaporated substances,
    an electronic gun disposed within said container for emitting thermions, which are hit on said evaporated substances existing between said source and said electrode to ionize said evaporated substances,
    a guiding means for deflecting electromagnetically a path of said emitted thermions and guiding said emitted thermions toward a space in the vicinity of said grid,
    a shielding member disposed within said container for preventing a direct impact, onto said substrate, of particles including said thermions emitted from said gun, and
    a slit disposed in said shielding member for allowing said guided thermions to pass therethrough and arrive at said space.

2. The apparatus of claim 1, wherein said gas comprises an active gas, an inert gas or a mixture of said active gas and said inert gas.

3. The apparatus of claim 1, wherein said source takes a form of a coil or a boat.

4. The apparatus of claim 1, wherein said source is made of tungsten or molybdenum.

5. The apparatus of claim 1, wherein said source is of electronic beam using type.

6. The apparatus of claim 1, wherein said electronic gun comprises a filament for generating said thermions.

7. The apparatus of claim 1, wherein said guiding means comprises a deflecting coil for deflecting said path magnetically, a capacitor for deflecting said path electronically, or an assembly of said deflecting coil and said capacitor.

* * * * *